(12) United States Patent
Becerra et al.

(10) Patent No.: US 9,806,626 B2
(45) Date of Patent: Oct. 31, 2017

(54) ELECTRIC MOTOR CONTROLLER AND METHODS OF DETERMINING INPUT POWER LINE ENERGIZATION

(71) Applicant: Regal Beloit America, Inc., Beloit, WI (US)

(72) Inventors: Roger Carlos Becerra, Fort Wayne, IN (US); Ludovic Andre Chretien, Columbia City, IN (US); Yao Da, Fort Wayne, IN (US); Peizhong Yi, Fort Wayne, IN (US); Lester Benjamin Manz, Paulding, OH (US)

(73) Assignee: Regal Beloit America, Inc., Beloit, WI (US)

( * ) Notice: Subject to any disclaimer, the term of this patent is extended or adjusted under 35 U.S.C. 154(b) by 581 days.

(21) Appl. No.: 14/270,607

(22) Filed: May 6, 2014

(65) Prior Publication Data

US 2015/0326152 A1    Nov. 12, 2015

(51) Int. Cl.
| | |
|---|---|
| *H02P 27/00* | (2006.01) |
| *H02M 5/12* | (2006.01) |
| *H02P 6/00* | (2016.01) |
| *H02M 5/06* | (2006.01) |
| *G01R 19/145* | (2006.01) |

(52) U.S. Cl.
CPC ............ *H02M 5/12* (2013.01); *G01R 19/145* (2013.01); *H02M 5/06* (2013.01); *H02P 6/001* (2013.01)

(58) Field of Classification Search
CPC . B60K 7/0007; H02P 6/001; B60L 2240/425; B60L 2240/427; B60L 2240/527; B60L 2240/529

USPC ....................................................... 318/400.3
See application file for complete search history.

(56) References Cited

U.S. PATENT DOCUMENTS

| | | | | |
|---|---|---|---|---|
| 4,751,978 | A * | 6/1988 | Drutchas .............. | B62D 5/0475 180/446 |
| 7,468,595 | B2 * | 12/2008 | Lee ........................... | H02P 1/04 318/801 |
| 8,049,459 | B2 | 11/2011 | Woodward | |
| 8,232,755 | B2 * | 7/2012 | Jeung ........................ | H02P 6/20 318/400.26 |
| 8,288,975 | B2 | 10/2012 | Mullin et al. | |
| 8,487,562 | B2 | 7/2013 | Solan, Jr. et al. | |
| 2003/0030408 | A1 * | 2/2003 | Ratz ........................ | F23N 1/062 318/772 |
| 2007/0069683 | A1 * | 3/2007 | Pant ......................... | H02P 1/18 318/807 |

(Continued)

*Primary Examiner* — Eduardo Colon Santana
*Assistant Examiner* — Gabriel Agared
(74) *Attorney, Agent, or Firm* — Armstrong Teasdale LLP (57) ABSTRACT

An electric motor controller and methods of determining which input power line of a plurality of input power lines of a motor drive controller has been energized are provided. An electric motor controller configured to be coupled to an electric motor includes a plurality of power input lines configured to receive an alternating current (AC) input voltage from an AC power source, an energized line detection device configured to sense that a power input line has been energized by the AC power source, and configured to output an isolated signal, and a rectifier configured to convert the AC input voltage having a frequency to a direct current (DC) voltage. The controller also includes a computing device coupled downstream from the energized line detection device and configured to determine which input power line has been energized.

21 Claims, 8 Drawing Sheets

(56) References Cited

U.S. PATENT DOCUMENTS

| | | | |
|---|---|---|---|
| 2008/0180048 A1* | 7/2008 | Mullin | H02P 6/34 318/400.26 |
| 2009/0082908 A1* | 3/2009 | Green | F24F 11/006 700/276 |
| 2010/0033119 A1 | 2/2010 | Becerra et al. | |
| 2011/0260671 A1* | 10/2011 | Jeung | H02P 6/08 318/701 |
| 2012/0230839 A1* | 9/2012 | Hussey | F04D 27/004 417/42 |
| 2014/0265957 A1* | 9/2014 | Hu | H02P 6/08 318/400.15 |

* cited by examiner

ELECTRIC MOTOR CONTROLLER AND METHODS OF DETERMINING INPUT POWER LINE ENERGIZATION

BACKGROUND

The field of the invention relates generally to electric motors, and more specifically, to electric motor controllers and methods of determining which of a plurality of motor controller input power lines has been energized.

A typical heating, ventilation, and air conditioning (HVAC) application includes a thermostat, a furnace or fan coil, a system controller, and a fan motor. User settings and current temperature measurements are used by the thermostat to provide the system controller with signals indicating the mode in which the HVAC application should operate. For example, a user may input into the thermostat a desired temperature of 67 degrees F. If the measured temperature of the room is 60 degrees F., the thermostat would signal the system controller to enter a heating mode.

The system controller energizes the fan motor via a set of relays based on the information provided to the system controller by the thermostat. Typically, certain known HVAC applications, such as residential HVAC systems, include a permanent split capacitor (PSC) electric motor to force airflow. The speed of the PSC motor is adjusted by taps on the motor winding. When the line voltage is applied to a lower turn count tap in the induction motor, the reduced stator flux produced results in a lower rotor speed under load, resulting in much inefficiency when using the PSC motor.

Some HVAC systems have begun using variable speed motors that can be electronically controlled to match the airflow requirements of the system to improve efficiency. However, retrofitting the PSC motor with a variable speed motor is costly, time-consuming, and requires complex changes to be made to the wiring and control system. Additionally, HVAC original equipment manufacturers (OEMs) typically require electric motors with unique parameters (i.e., torque, speed, airflow direction), so the motor can be customized to the particular system in which it is installed. Changing the operating parameters after manufacture is also a time-consuming and difficult process. As a result, electric motor manufacturers and installers keep an extensive inventory of motors to accommodate for the large variety of different HVAC systems.

BRIEF DESCRIPTION

In one aspect, an electric motor controller configured to be coupled to an electric motor is provided. The electric motor drive controller includes a plurality of power input lines configured to receive an alternating current (AC) input voltage from an AC power source, an energized line detection device configured to sense that a power input line has been energized by the AC power source, and configured to output an isolated signal, and a rectifier configured to convert the AC input voltage having a frequency to a direct current (DC) voltage. The controller also includes a computing device coupled downstream from the energized line detection device and configured to determine which input power line has been energized.

In another aspect, a method of determining an energized power line of a plurality of input power lines of a motor drive controller is provided. The controller is configured to be coupled to a power source and to an electric motor. The method includes receiving, by a computing device of the motor drive controller, an isolated signal output by an energized line detection device. The isolated signal corresponds to which of the plurality of input power lines has been energized. The method also includes receiving, by the computing device, a measured motor operation condition of the electric motor and determining, by the computing device, which input power line of the plurality of input power lines has been energized based on the isolated signal and the measured motor operation condition.

In yet another aspect, a heating, ventilation, and air conditioning (HVAC) motor control system is provided. The HVAC control system includes an HVAC system controller configured to determine an operating mode of the HVAC motor control system, an electric motor, and an electric motor drive controller coupled to the electric motor. The motor drive controller includes a plurality of power input lines configured to receive an alternating current (AC) input voltage from an AC power source, an energized line detection device configured to sense that a power input line has been energized by the AC power source, and configured to output an isolated signal, and a rectifier configured to convert the AC input voltage having a frequency to a direct current (DC) voltage. The controller also includes a computing device coupled downstream from the energized line detection device and is configured to receive the isolated signal from the energized line detection device, receive a measured motor operation condition of the electric fan motor, and determine which input power line has been energized based on the isolated signal and the measured motor operation condition.

DETAILED DESCRIPTION

Figure 1:
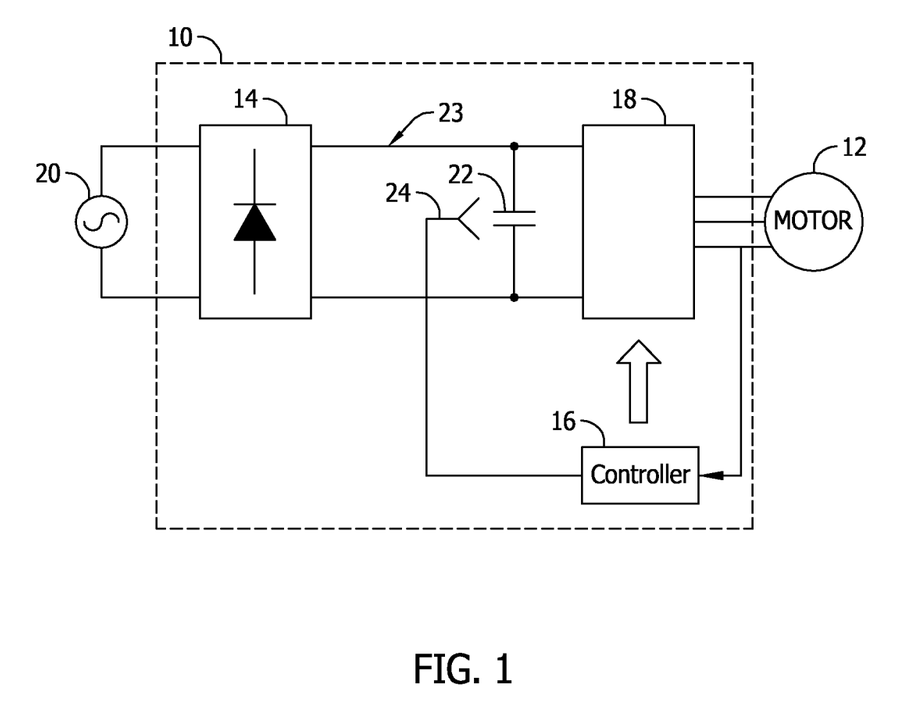
FIG. 1 is a functional diagram of a motor controller that may be used for operating an electric motor.

FIG. 1 is a functional diagram of a motor drive controller 10 that may be used for operating an electric motor 12. In the exemplary embodiment, motor drive controller 10 includes a rectifier 14, a controller 16, and an inverter 18. Motor drive controller 10 is coupled to a power supply 20 for receiving input power to drive electric motor 12. Electric motor 12 is coupled to and drives a load (not shown).

In the exemplary embodiment, power supply 20 supplies a single-phase alternating current (AC) voltage to motor controller 10. However, power supply 20 may supply any other type of input voltage that enables motor drive controller 10 to function as described herein. Rectifier 14 receives an AC input voltage from a power supply 20 and rectifies it to produce a pulsed DC voltage. Inverter 18 conditions the pulsed DC voltage, and supplies it to electric motor 12, which uses the power to drive the load. In the exemplary embodiment, inverter 18 converts the pulsed DC voltage to a three-phase AC voltage. Alternatively, inverter 18 converts the pulsed DC voltage to any type of voltage that enables motor controller to function as described herein.

Figure 2:
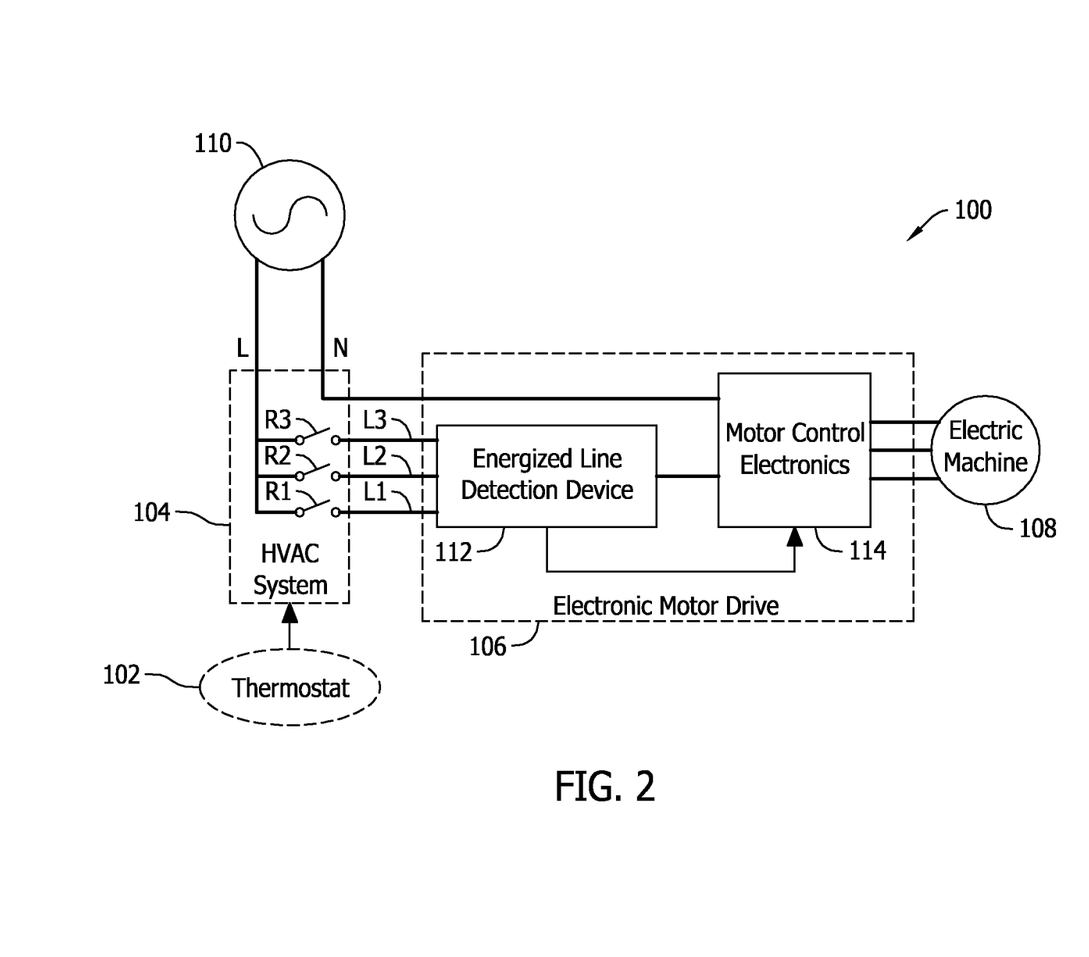
FIG. 2 is a block diagram of an exemplary heating, ventilation, and air conditioning (HVAC) fan motor control system.

FIG. 2 is a block diagram of an exemplary heating, ventilation, and air conditioning (HVAC) fan motor control system 100. HVAC fan motor control system 100 is included in an HVAC application (not shown in FIG. 2), such as, but not limited to, a residential HVAC system and/or a commercial HVAC system. Fan motor control system 100 includes a thermostat 102, an HVAC system controller 104, an electronic motor controller 106, and an electric fan motor 108. In the exemplary embodiment, electric motor 108 is an electrically commutated motor (ECM). Fan motor control system 100 is coupled to and configured to receive power from a power supply 110. In the exemplary embodiment, power supply 110 is an alternating current (AC) power supply configured to provide 120 VAC (volts alternating current) or 240 VAC. However, in alternative embodiments, power supply 110 may provide any amount of power that enables fan motor control system 100 to function as described herein.

Thermostat 102 is configured to control the mode in which the HVAC application is operating, for example, a cooling mode, a heating mode, or a fan only mode. Typically, cooled air is circulated through the HVAC system when in the cooling mode, heated air is circulated through the HVAC system in the heating mode, and air that has not been heated or cooled is circulated through the HVAC system in the fan only mode. As described herein, fan motor control system 100 will be referred to as a three-speed system (i.e., system 100 has three operating speeds relating to the cooling, heating, and fan only modes). However, fan motor control system 100 is not limited to being a three-speed system. In alternative embodiments, fan motor control system 100 may operate at any number of speeds that enables system 100 to function as described herein.

The mode of operation is determined by thermostat 102 based on user selections and/or a measured temperature. For example, in one embodiment, thermostat 102 includes a switch that enables a user to select from "OFF," "COOL," or "HEAT" (not shown in FIG. 2). When "OFF" is selected, thermostat 102 signals HVAC system controller 104 to turn off the HVAC application. When "COOL" or "HEAT" is selected, thermostat 102 signals HVAC system controller 104 to operate the HVAC application in cooling mode or in heating mode, cooling mode, or fan only mode depending upon the current measured temperature and the set desired temperature. Thermostat 102 may include a temperature sensing device, for example, a thermistor, or may be coupled to a temperature sensing device (not shown in FIG. 2) positioned remotely from thermostat 102.

Thermostat 102 may also include a switch that enables a user to select fan modes, for example, either "ON" or "AUTO" (not shown in FIG. 2). When "ON" is selected, thermostat 102 signals HVAC system controller 104 to continuously operate the fan. When "AUTO" is selected, the signal transmitted from thermostat 102 to HVAC system controller 104 depends upon the measured temperature and the set desired temperature, and the fan may either be on or off.

Thermostat 102 transmits a signal to HVAC system controller 104. The signal may include a call for cooling, heating, or fan only operation of the HVAC application. HVAC system controller 104 includes four outputs coupled to motor controller 106, a neutral line N, a fan line L1, a heating line L2, and a cooling line L3. HVAC system controller 104 also includes a relay R1 coupled to line L1, a relay R2 coupled to line L2, and a relay R3 coupled to line L3. When HVAC system controller 104 receives a heating signal from thermostat 102, HVAC system controller 104 closes relay R2 and delivers either 120V or 240V over line L2 to motor controller 106. When HVAC system controller 104 receives a cooling signal from thermostat 102, HVAC system controller 104 closes relay R3 and delivers either 120V or 240V over line L3 to motor controller 106. Fan mode, heating mode, and cooling mode are not limited to being associated with line L1, line L2, and line L3, respectively. Alternatively, any of the fan, heating, and cooling modes may be associated with any of lines L1, L2, and L3.

In the exemplary embodiment, motor controller 106 is similar to motor controller 10 (shown in FIG. 1). Motor controller 106 also includes an energized line detection device 112 and motor electronics 114. Energized line detection device 112 is configured to sense which one of lines L1, L2, or L3 is energized, as is described in more detail herein. Energized line detection device 112 transmits a signal including power and operation instruction information to motor electronics 114, which conditions the power and determines whether to apply a speed or a torque to electric motor 108 based on the operational information.

Figure 3:
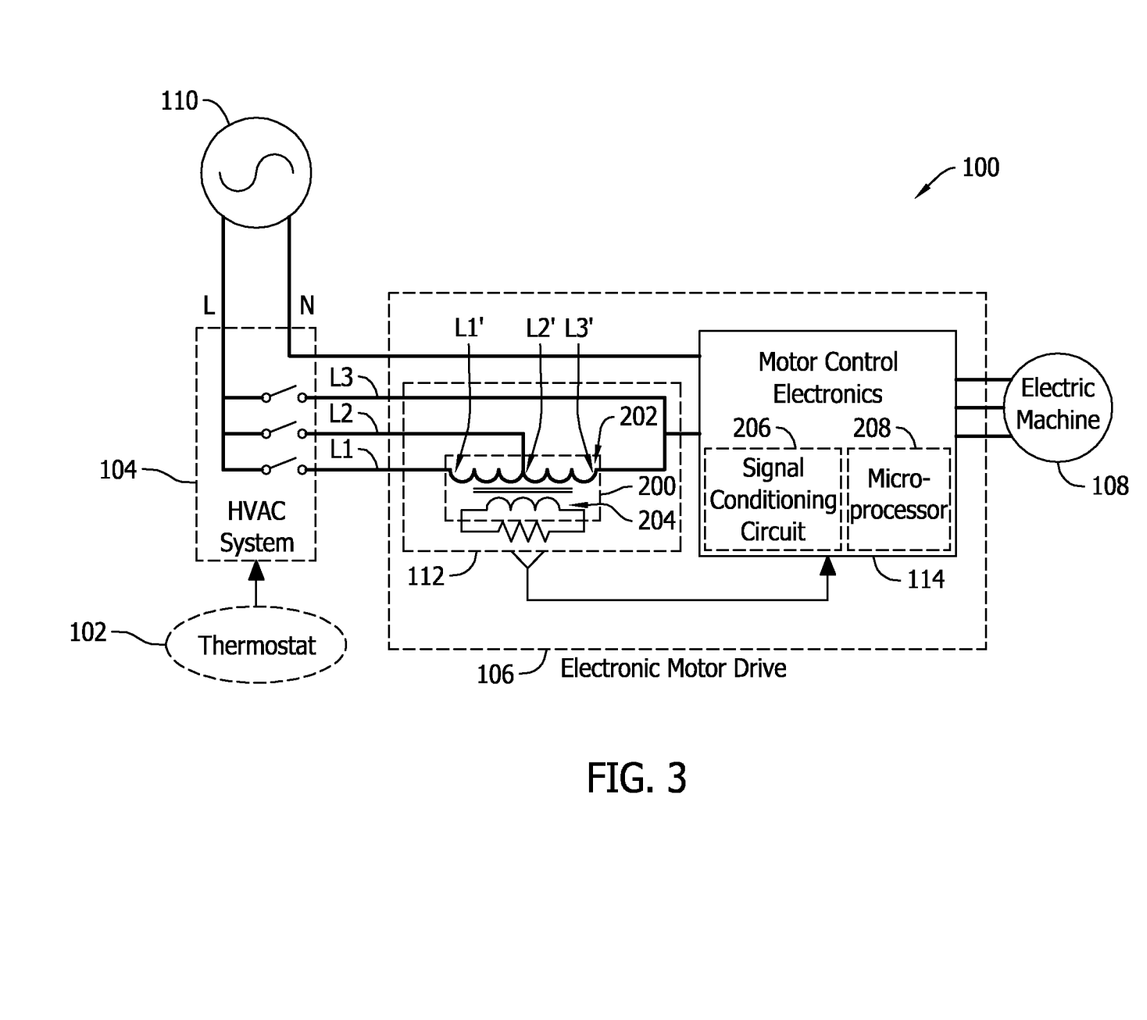
FIG. 3 is a schematic diagram of the motor controller shown in FIG. 2 including a current transformer.

FIG. 3 is a schematic diagram of an exemplary motor controller 106 where energized line detection device 112 is a current sensing circuit. In the exemplary embodiment, motor controller 106 includes energized line detection device 112 and motor electronics 114 (both shown in FIG. 2).

In the exemplary embodiment, energized line detection device 112 includes a transformer 200 having a primary winding 202 and a secondary winding 204. Primary winding 202 includes a plurality of taps for coupling to the lines of HVAC system controller 104. In the exemplary embodiment, wherein system 100 is a three-speed system, each of lines L1, L2, and L3 are coupled to primary winding 202 at taps L1', L2', and L3', respectively. More specifically, in the exemplary embodiment, tap L1' is not on a turn of transformer 200, so operation at the lowest speed (i.e., line L1) is assumed from the state of electric motor 108 being powered. Tap L2' is at a first predetermined number of turns of primary winding 202 and L3' is at a second predetermined number of turns of primary winding 202. The second predetermined number of turns is larger than the first predetermined number of turns. Operation at the intermediate speed (i.e., line L2) or top speed (i.e., line L3) is determined by current sourcing taps L2' and L3' of primary winding 202.

In the exemplary embodiment, secondary winding 204 generates a reduced-current signal that is proportional to the current input into primary winding 202. A single reduced-current signal is input into motor electronics 114. Motor electronics 114 use the reduced-current signal to determine which of lines L1, L2, and L3 is energized. In alternative embodiments, current transformer 200 may output a voltage signal or a conditioned signal based on the output of current transformer 200. In an alternative embodiment, transformer 200 may be a voltage transformer. Power diode doublers (not shown) may be included with the use of a voltage transformer to permit detection of the relays that provide both the power to electric motor 108 and the operation instruction information.

In the exemplary embodiment, motor electronics 114 include a signal conditioning circuit 206 and a computing device 208. Electric motor 108 is powered by line voltage provided from line L1 to neutral line N input to signal conditioning circuit 206. Signal conditioning circuit 206 may include an electromagnetic interference (EMI) filter for filtering high frequency components produced by motor electronics 114 from power supply 110. Signal conditioning circuit 206 may also include a rectifier, for example, rectifier 14 (shown in FIG. 1) for producing a rectified AC voltage used to power electric motor 108.

Computing device 208 receives the signal output by transformer 200 and implements an algorithm to determine which of the input line taps is supplying current, as is described in more detail herein. This determination is effected by the extensive calculation capability of computing device 208 and a realization of a relative change in current supplied as the single phase input voltage cycles through its range of instantaneous voltages. Based on the comparison, computing device 208 applies an operating profile stored in a memory device of computing device 208. The operating profile may apply a constant torque, a constant speed, or a constant airflow. The operating profile may also include a variation in time or profile including slew rates and/or ramps.

In some embodiments, computing device 208 is implemented in one or more processing devices, such as a microcontroller, a programmable gate array, a reduced instruction set circuit (RISC), an application specific integrated circuit (ASIC), etc. Accordingly, in this exemplary embodiment, algorithm 500 (shown in FIG. 5) is constructed of software and/or firmware embedded in one or more processing devices. In this manner, computing device 208 is programmable, such that instructions, intervals, thresholds, and/or ranges, etc. may be programmed for a particular electric motor 102 and/or operator of electric motor 102. Algorithm 500 may be wholly or partially provided by discrete components, external to one or more processing devices.

Figure 4:
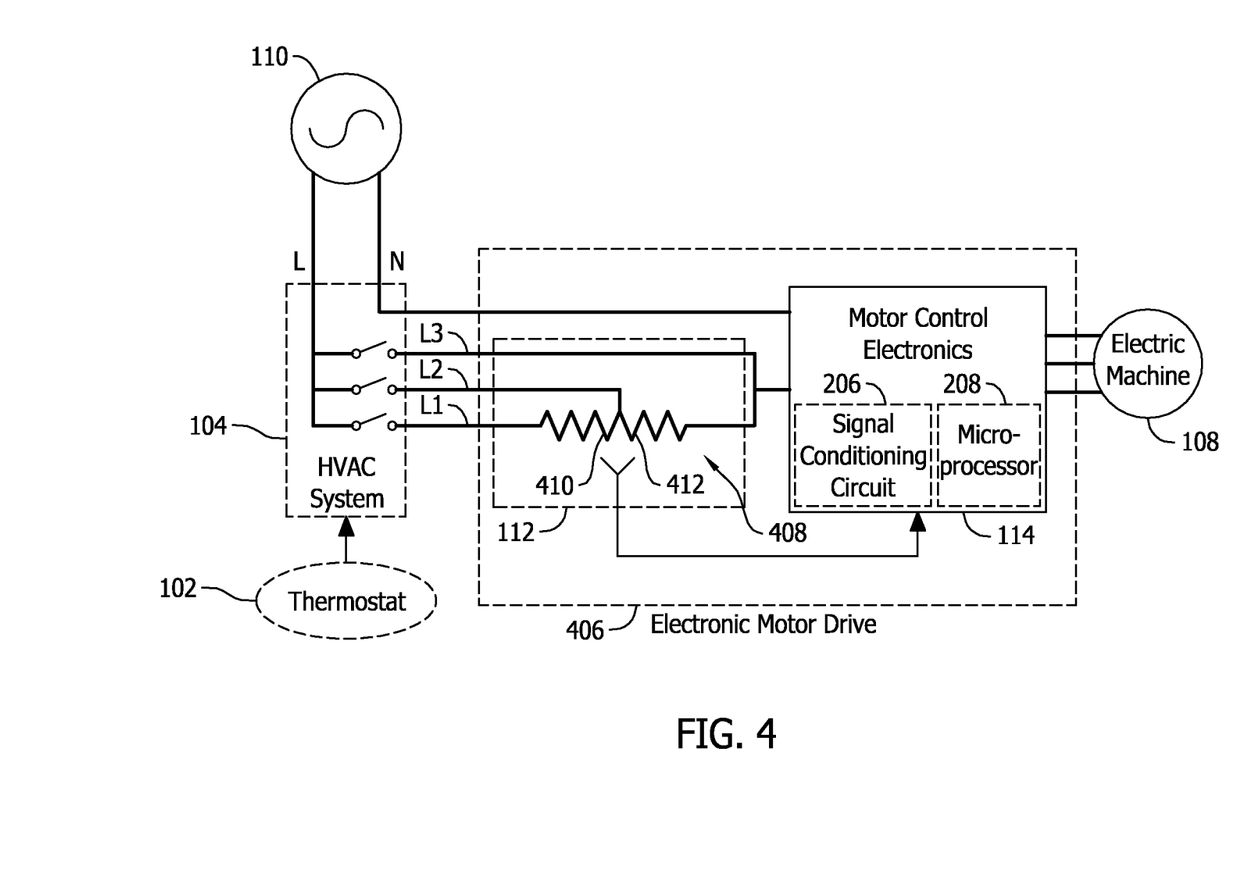
FIG. 4 is a circuit diagram of the motor controller shown in FIG. 2 including a voltage sensing circuit.

FIG. 4 is a schematic diagram of an exemplary motor controller 406 where energized line detection device 112 (shown in FIG. 2) is a voltage sensing circuit. Motor controller 406 may be used with system 100 (shown in FIG. 2).

In the exemplary embodiment, energized line detection device 112 includes a resistor bank 408 that includes at least a first resistor 410 and a second resistor 412. In the exemplary embodiment, wherein system 100 is a three-speed system, each of lines L1, L2, and L3 are coupled to resistor bank 408 at different positions relative to resistors 410 and 412. More specifically, in the exemplary embodiment, line L1 is coupled to an input of first resistor 410 and thus, does not encounter any resistance, so operation of electric motor 108 at the lowest speed (i.e., line L1) is assumed from the state of electric motor 108 being powered. Line L2 is coupled to an output of first resistor 410, so voltage input via line L2 is affected by a resistance value of first resistor 410. Line L3 is coupled to an output of second resistor 412, so voltage input via line L3 is affected by a resistance value of first and second resistors 410 and 412. Operation at the intermediate speed (i.e., line L2) or the top speed (i.e., line L3) is determined by voltage sourcing resistor bank 408. The voltage signal output by the voltage sensing circuit is then transmitted to computing device 208, as described above in the description of FIG. 3.

Figure 5:
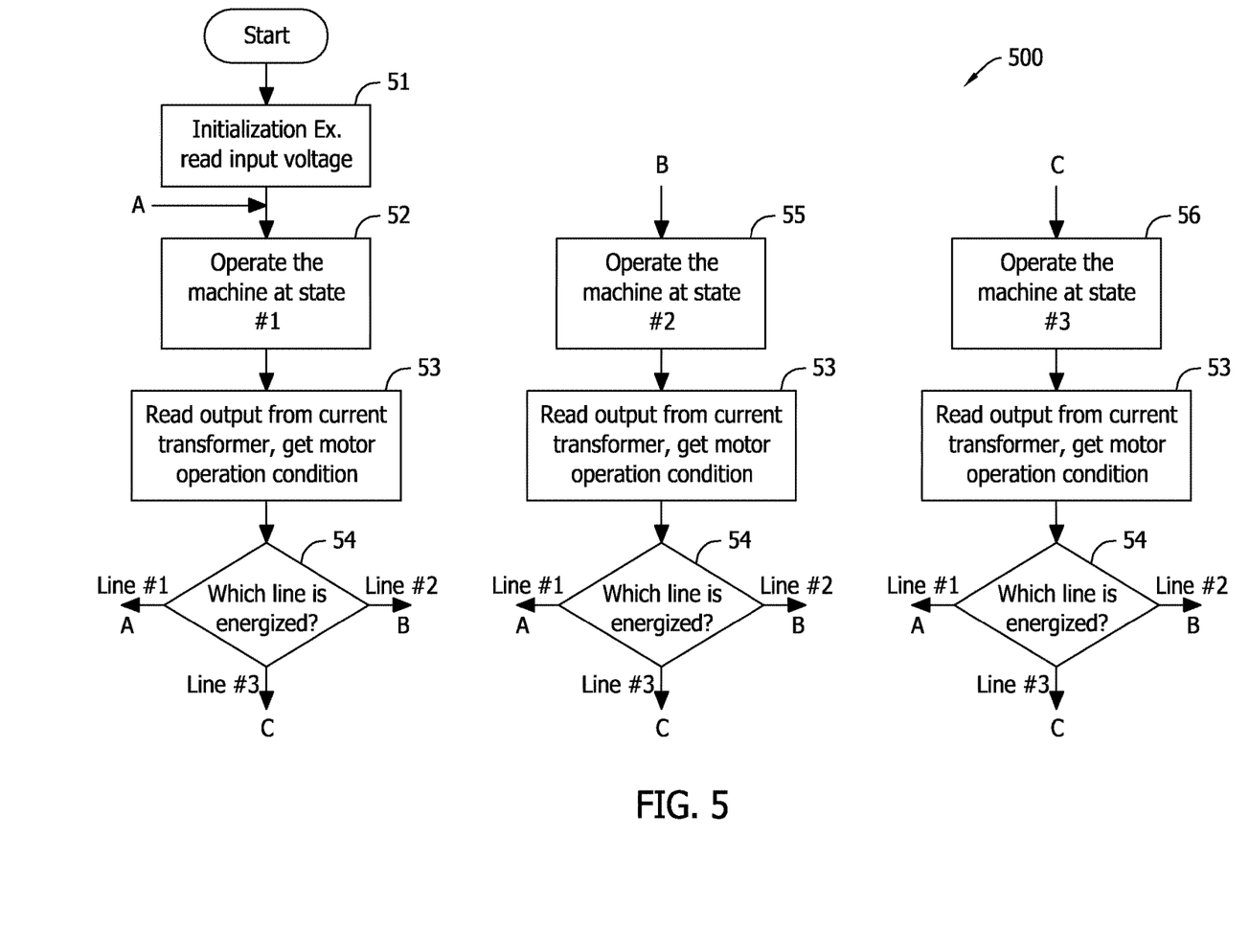
FIG. 5 is a flow chart of an exemplary algorithm implemented by the computing device shown in FIGS. 3 and 4.

FIG. 5 is a flow chart of an exemplary algorithm 500 implemented by computing device 208 (shown in FIGS. 3 and 4). In the exemplary embodiment, algorithm 500 is designed for three input lines, for example, lines L1, L2, and L3, as described above. Moreover, in the exemplary embodiment, an energized line L1 indicates operation of electric motor 108 at a first state, or lowest speed. An energized line L2 indicates operation of electric motor 108 at a second state, or intermediate speed. An energized line L3 indicates operation of electric motor 108 at a third state, or highest speed. At a first step S1, computing device 208 measures AC input voltage from power supply 110 (shown in FIG. 2). As previously described, in the exemplary embodiment, operation of electric motor 108 at the lowest speed (i.e., line L1) is assumed from the state of electric motor 108 being powered. Accordingly, at step S2, computing device 208 operates electric motor 108 at the first state.

In the exemplary embodiment, at step S3, computing device 208 reads an output from current transformer 200 (shown in FIG. 3) or resistor bank 408 (shown in FIG. 4). The output from current transformer 200 includes at least one of a current signal, a voltage signal, or a conditioned signal based on the output from current transformer 200. Computing device 208 also receives a motor operation condition of electric motor 108. The motor operation condition includes at least one of motor output power and motor input power. In some embodiments, computing device 208 may have additional inputs to enhance accuracy when determining which line is energized. Additional inputs may include, but are not limited to including, AC input voltage, DC link voltage, AC line power factor, and/or motor efficiency.

At step S4, computing device 208 determines which of lines L1, L2, and L3 is energized using a discrimination method. In the exemplary embodiment, the discrimination method includes computing device 208 using a lookup table to determine which of lines L1, L2, and L3 has been energized. Computing device 208 looks up the output from current transformer 200 and the measured motor operation condition in the lookup table to tell which line is energized. If computing device 208 determines that line L1 is energized, computing device 208 loops back to step S2 and continues to operate electric motor 108 at the first state. After a predetermined time period, computing device 208 repeats step S3 and step S4 to determine whether a new operating state has been input.

In the exemplary embodiment, if computing device 208 determines at step S4 that line L2 has been energized, then computing device 208 performs step S5 of algorithm 500, where it operates electric motor 108 at the second state. After a predetermined time period, computing device 208 repeats step S3 and step S4 to determine whether a new operating state has been input.

In the exemplary embodiment, if computing device 208 determines at step S4 that line L3 has been energized, then computing device 208 performs step S6 of algorithm 500, where it operates electric motor 108 at the third state. After a predetermined time period, computing device 208 repeats step S3 and step S4 to determine whether a new operating state has been input.

Figure 6:
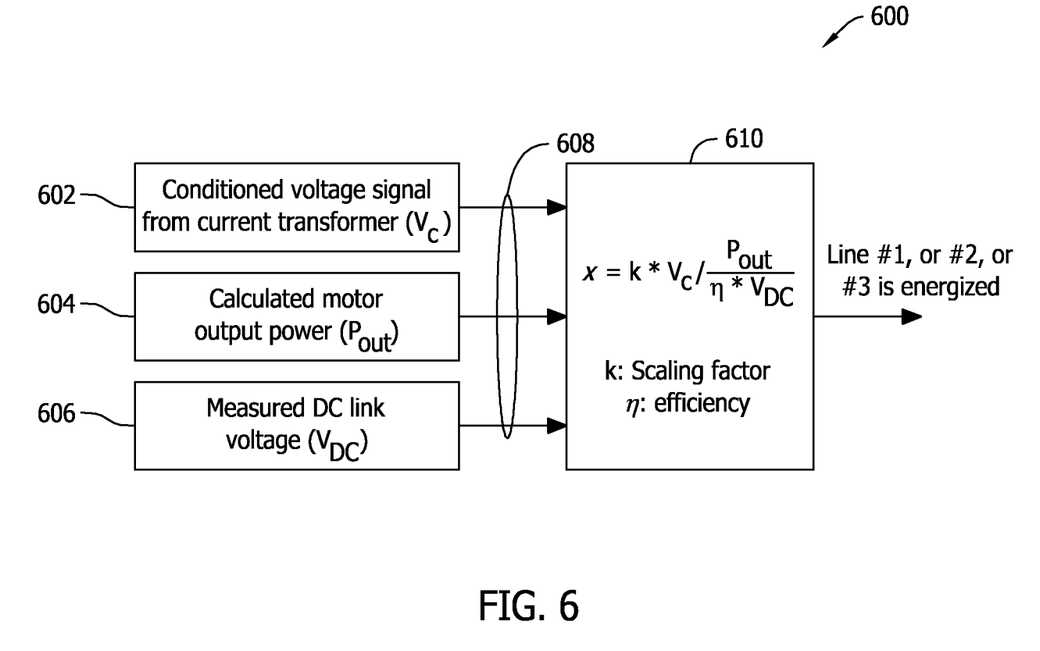
FIG. 6 is a block diagram of an alternative discrimination method that may be used by the computing device shown in FIGS. 3 and 4 when implementing the algorithm shown in FIG. 5 to determine which line has been energized.

FIG. 6 is a block diagram of an alternative discrimination method 600 that may be used by computing device 208 when implementing algorithm 500 to determine which line has been energized. In the exemplary embodiment, discrimination method 600 includes receiving 602 a conditioned voltage signal $V_c$ from current transformer 200 (shown in FIG. 3). Discrimination method 600 also includes determining 604 motor output power $P_{out}$ and measuring 606 DC link voltage $V_{DC}$. Conditioned voltage signal $V_c$, motor output power $P_{out}$, and DC link voltage $V_{DC}$ are input 608 into an energized line equation. The energized line equation is given by:

$$x = k \times Vc / \frac{P_{out}}{\eta + V_{DC}} \qquad (1)$$

In equation (1), k represents a predetermined scaling factor and η represents motor efficiency. The inputs are adjusted 610 by motor efficiency η and predetermined scaling factor k, which gives an output value x. Computing device 208 compares output value x to a predetermined set of values that indicate which line is energized.

Figure 7:
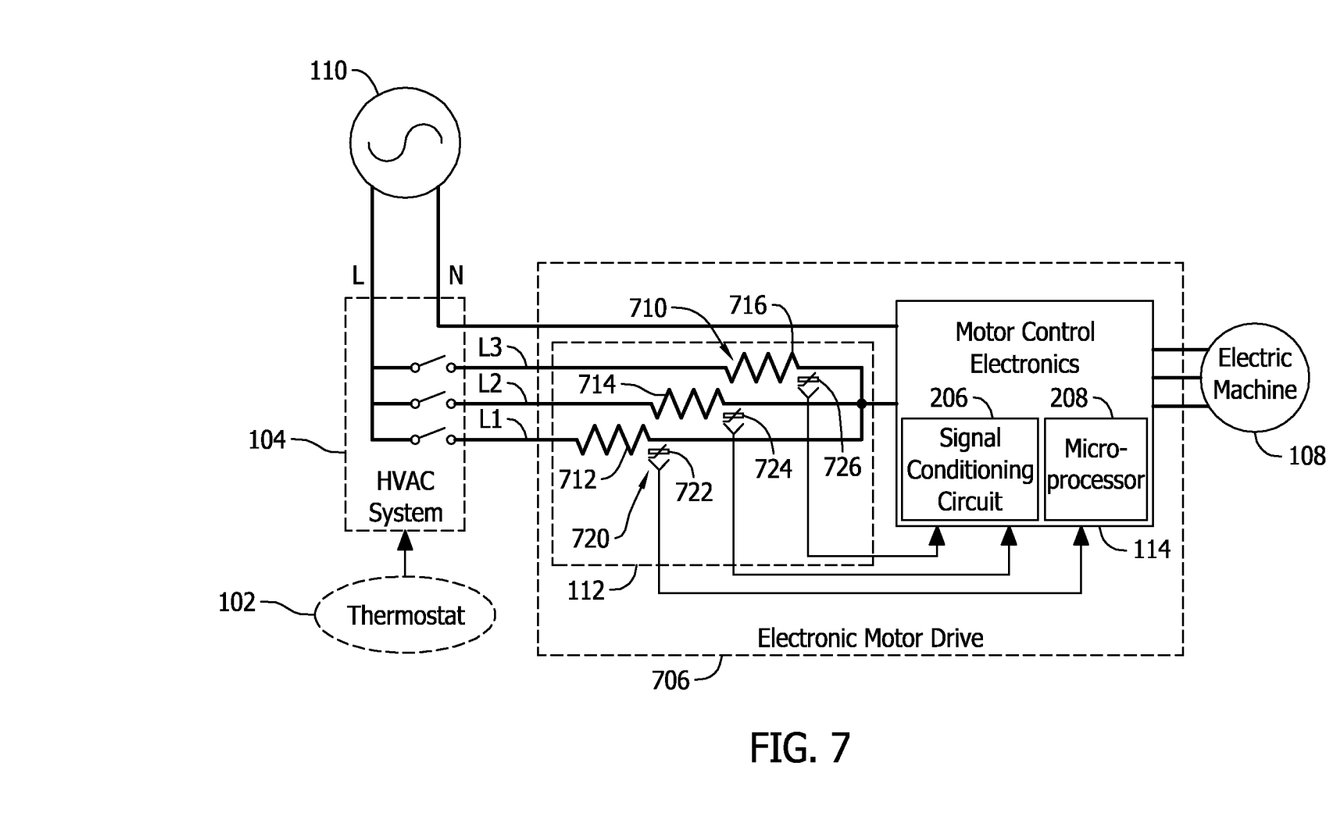
FIG. 7 is a schematic diagram of an exemplary motor controller where the energized line detection device shown in FIG. 2 is a temperature sensing circuit.

FIG. 7 is a schematic diagram of an exemplary motor controller 706 where energized line detection device 112 is a temperature sensing circuit. Motor controller 706 may be used with system 100 (shown in FIG. 2).

In the exemplary embodiment, energized line detection device 112 includes at least one heat generation device 710 and at least one temperature sensor 720. Heat generation device 710 is coupled to at least one of lines L1, L2, and/or L3. In the exemplary embodiment, wherein system 100 is a three-speed system, energized line detection device 112 includes heat generation device 710 coupled to each of lines L1 and L2. More specifically, in the exemplary embodiment, energized line detection device 112 includes a first heat generation device 712 coupled to line L1 and a second heat generation device 714 coupled to line L2. In some embodiments, energized line detection device 112 further includes a third heat generation device 716 coupled to line L3. Moreover, an amount of heat generated by heat generation device 710 on lines L1, L2, and/or L3 may be the same or different. Heat generation device 710 may include any type of heat generator and/or use any type of heat generation methods including, but not limited to, using parasitic resistance of printed circuit board (PCB) traces, decreasing a thickness of the traces to obtain a higher resistance, and/or using resistors and/or thermistors.

In the exemplary embodiment, temperature sensor 720 is positioned adjacent heat generation device 710. More specifically, in the exemplary embodiment, energized line detection device 112 includes a first temperature sensor 722 positioned adjacent to line L1 and a second temperature sensor 724 positioned adjacent to line L2. First temperature sensor 722 is configured to measure a temperature of first heat generation device 712 coupled to line L1 and second temperature sensor 724 is configured to measure a temperature of second heat generation device 714 coupled to line L2. Although two temperature sensors 720 are illustrated in FIG. 7, any number of temperature sensors 720 may be used to detect which of lines L1, L2, and L3 is energized. For example, in one embodiment, a third temperature sensor 726 is positioned adjacent to line L3 and is configured to measure a temperature of third heat generation device 716. Temperature sensor 720 may be any device having an output signal that is sensitive to temperature including, but not limited to, a thermistor and/or temperature sensitive coils.

In the exemplary embodiment, to detect which line L1, L2, or L3 is energized, first and second temperature sensors 722 and 724 periodically measure a temperature of first and second heat generation devices 712 and 714, respectively, and periodically transmit temperature measurement signals to motor electronics 114 for processing. The temperature measurement signals may be conditioned by signal conditioning circuit 206 before being transmitted to computing device 208 or may be transmitted directly to computing device 208 without being conditioned. In the exemplary embodiment, computing device 208 receives the temperature measurement signals and determines if a change in temperature of first heat generation device 712 or second heat generation device 714 has occurred. Computing device 208 also stores the received temperature measurement signals in a memory device (not shown) associated with computing device 208.

During operation, when motor controller 706 is coupled to one of lines L1, L2, or L3, current travels through that particular line L1, L2, or L3 to heat generation device 710, which introduces loss. The loss is generated by line resistance and generates heat, increasing a temperature of heat generation device 710. The temperature increases as the loss increases. Initially, none of lines L1, L2, or L3 are coupled to motor controller 706. First and second temperature sensors 722 and 724 measure ambient temperature, so there is no measured temperature change realized by computing device 208. If line L1 is energized, first temperature sensor 722 detects an increase in temperature of first heat generation device 712 over a short period of time, while second sensor 724 does not sense a temperature change in second heat generation device 714. Specifically, computing device 208 compares present temperature measurement signals received from first and second temperature sensors 722 and 724 to prior temperature measurement signals stored in the memory device. Based on the increase in temperature detected by first temperature sensor 722, computing device 208 determines that line L1 is energized and transmits a control signal to electric motor 108 accordingly.

At a later time, if line L2 is energized, second temperature sensor 724 detects an increase in temperature of heat generation device 714, and first temperature sensor 712 detect a decrease in temperature of first heat generation device 712. Computing device 208 determines that line L2 is energized and adjusts the a control signal being transmitted to electric motor 108 If at a later time, line L3 becomes energized, both of first and second temperature sensors 712 and 714 detect a decrease in temperature of first and second heat generation devices 712 and 714, respectively. Based on the temperature drop detected by both of first and second temperature sensors 712 and 714, computing device 208 determines that line L3 is energized and adjust the motor control signal accordingly.

Figure 8:
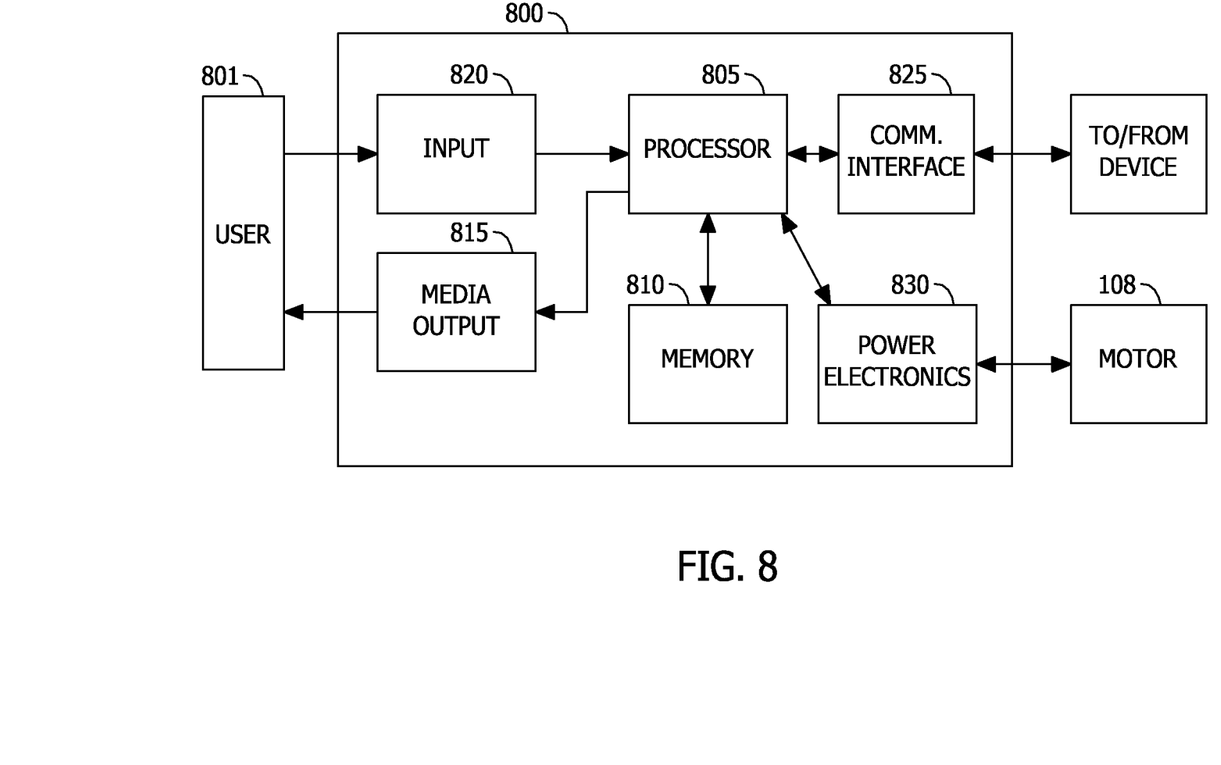
FIG. 8 is a block diagram of an example computing device that may be incorporated in any of the motor controllers shown in FIGS. 3, 4, and 7.

FIG. 8 is a block diagram of an example computing device 800 that may be incorporated in any of motor controllers 106, 406, and 706 (FIGS. 3, 4, and 7). For example, computing device 208 (FIGS. 3, 4, and 7) may include components of computing device 800. Computing device 800 includes a processor 805 for executing instructions. Processor 805 may include a microprocessor, a microcontroller, and/or any other known type of processing unit. In some implementations, executable instructions are stored in a memory area 810. Processor 805 may include one or more processing units (e.g., in a multi-core configuration). Memory area 810 is any device allowing information such as executable instructions and/or other data to be stored and retrieved. Memory area 810 stores settings for operating motor 108, as described herein. Memory area 810 may include one or more computer-readable media.

In some implementations, computing device 800 also includes at least one media output component 815 for presenting information to user 801. Media output component 815 is any component capable of conveying information to user 801. In some implementations, media output component 815 includes an output adapter such as a video adapter and/or an audio adapter. An output adapter is operatively coupled to processor 805 and operatively couplable to an output device such as a display device (e.g., a liquid crystal display (LCD), one or more light emitting diodes (LED), an organic light emitting diode (OLED) display, cathode ray tube (CRT), or "electronic ink" display) or an audio output device (e.g., a speaker or headphones). In other implementations, computing device 800 does not include media output component 815. For example, some implementations of computing device 800 may not include media output component 815.

In some implementations, computing device 800 includes an input device 820 for receiving input from user 801. Input device 820 may include, for example, one or more buttons, a keypad, a touch sensitive panel (e.g., a touch pad or a touch screen), and/or a microphone. A single component such as a touch screen may function as both an output device of media output component 815 and input device 820. Some implementations of computing device 800, for example some implementations of computing device 208, do not include input device 820.

Computing device 800 may also include a communication interface 825, which is communicatively couplable to another device. For example, communication interface 825 may enable wireless communication with at least one client computing device (not shown), for example, through a short range wireless communication protocol such as Bluetooth™ or Z-Wave™, through a wireless local area network (WLAN) implemented pursuant to an IEEE (Institute of Electrical and Electronics Engineers) 802.11 standard (i.e., WiFi), and/or through a mobile phone (i.e., cellular) network (e.g., Global System for Mobile communications (GSM), 3G, 4G) or other mobile data network (e.g., Worldwide Interoperability for Microwave Access (WIMAX)). In some implementations, communication interface 825 is directly capable of enabling such wireless communications. For example, in some implementations, communication interface 825 includes a wireless communication device. Additionally, communication interface 825 may couple motor controller 106 to motor 108. In such implementations, communication interface 825 may include, for example, one or more conductors for transmitting electrical signals and/or power to and/or from motor 108. Additionally, computing device 800 may also include power electronics 830 which may be coupled, for example, to processor 805 and motor 108.

Embodiments of the systems and methods described herein enable a manufacturer to produce a motor drive controller for an electric motor without including a typical high capacitance capacitor that can determine which input power line has been energized using a single sensing circuit, while maintaining an ability of the motor drive controller to regulate an average torque, enhance efficiency, and control envelope of the electric motor. Accordingly, manufacturers may produce less expensive and less bulky motor drive controllers compared to typical motor drive controllers.

A technical effect of the methods and systems described herein may include one or more of: (a) receiving, by a computing device of a motor drive controller, an isolated signal output by an energized line detection device, the isolated signal corresponding to which input power line of the plurality of input power lines has been energized; (b) receiving, by the computing device, a measured motor operation condition of the electric motor; and (c) determining, by the computing device, which input power line of the plurality of input power lines has been energized based on the isolated signal and the measured motor operation condition.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electric motor drive controller configured to be coupled to an electric motor, said electric motor drive controller comprising:
  a plurality of power input lines, each power input line of said plurality of input power lines configured to receive an alternating current (AC) input voltage from an AC power source;
  an energized line detection device configured to sense that a power input line of said plurality of power input lines has been energized by the AC power source, and configured to output an isolated signal, said energized line detection device comprising:
    a first heat generation device coupled to a first input power line of said plurality of input power lines;
    a first temperature sensor positioned adjacent to said first heat generation device and configured to detect a temperature of said first heat generation device;
    a second heat generation device coupled to a second input power line of said plurality of input power lines; and
    a second temperature sensor positioned adjacent to said second heat generation device and configured to detect a temperature of said second heat generation device; and
  a computing device coupled downstream from said energized line detection device and configured to determine which input power line of said plurality of input power lines has been energized.

2. A controller in accordance with claim 1, wherein to determine which input power line has been energized, said computing device is further configured to measure an AC input voltage from the AC power source.

3. A controller in accordance with claim 2, wherein said computing device is further configured to command the electric motor to operate in a first state when said controller receives power from the AC power source.

4. A controller in accordance with claim 1, wherein said computing device is further configured to receive the isolated signal including at least one of a current signal, a voltage signal, and a conditioned signal based on the output of said energized line detection device.

5. A controller in accordance with claim 4, wherein said computing device is further configured to receive a measured motor operation condition.

6. A controller in accordance with claim 5, wherein the measured motor operation condition includes at least one of an output power of the electric motor and an input power of the electric motor.

7. A controller in accordance with claim 5, wherein said computing device is configured to determine which input power line has been energized based on the isolated signal and the measured motor operation condition.

8. A controller in accordance with claim 7, wherein said computing device is configured to determine which input power line of said plurality of input power lines has been energized based on a lookup table that relates the isolated signal and the measured motor operation condition to an energized state of said each input power line.

9. A controller in accordance with claim 7, wherein said computing device is configured to:
command the electric motor to operate in a first state when said computing device determines that a first power input line has been energized;
command the electric motor to operate in a second state when said computing device determines that a second power input line has been energized; and
command the electric motor to operate in a third state when said computing device determines that a third power input line has been energized.

10. A controller in accordance with claim 7, wherein said computing device is further configured to:
receive at least one of an AC input voltage, a DC link voltage, an AC line power factor, and a motor efficiency; and
determine which input power line of said plurality of input power lines has been energized based on the isolated signal, the measured motor operation condition, and the received at least one of an AC input voltage, a DC link voltage, an AC line power factor, and a motor efficiency.

11. A controller in accordance with claim 1, wherein said energized line detection device comprises a voltage sensing circuit that includes a plurality of resistors coupled in series, said each input power line coupled across a different resistor, said computing device configured to receive the isolated signal output by said voltage sensing circuit.

12. A controller in accordance with claim 1, wherein said computing device is configured to:
periodically receive temperature measurement signals from said first and second temperature sensors;
determine whether one of said first heat generation device and said second heat generation device has changed in temperature by comparing a received temperature measurement signal to a prior temperature measurement signal; and
determine which input power line has been energized based on the compared temperature measurement signals.

13. A controller in accordance with claim 12, wherein said computing device is further configured to determine which input power line has been energized based on at least one of a temperature change of one of said first and second heat generation devices and a temperature difference between said first and second heat generation devices.

14. A method of determining an energized power line of a plurality of input power lines of a motor drive controller configured to be coupled to a power source and to an electric motor, the power source providing an AC input voltage having a frequency, said method comprising:
receiving, by a computing device of the motor drive controller, an isolated signal output by an energized line detection device, the isolated signal corresponding to which of the plurality of input power lines has been energized, wherein the energized line detection device includes a first heat generation device coupled to a first input power line of the plurality of input power lines and a second heat generation device coupled to a second input power line of the plurality of input power lines;
periodically receiving temperature measurement signals from a first temperature sensor positioned adjacent to the first heat generation device and a second temperature sensor positioned adjacent to the second heat generation device;
determining whether one of the first heat generation device and the second heat generation device has changed in temperature by comparing a present temperature measurement signal to a prior temperature measurement signal; and
determining, by the computing device, which input power line of the plurality of input power lines has been energized based on the compared temperature measurement signals.

15. A method in accordance with claim 14, wherein receiving the isolated signal comprises receiving at least one of a current signal, a voltage signal, and a conditioned signal based on the output of the energized line detection device.

16. A method in accordance with claim 14, wherein receiving the measured motor operation condition of the electric motor comprises receiving at least one of an output power of the electric motor and an input power of the electric motor.

17. A method in accordance with claim 14, wherein determining which input power line has been energized comprises accessing a lookup table that relates the isolated signal and the measured motor operation condition to an energized state of each of the plurality of input power lines.

18. A method in accordance with claim 14, wherein determining which input power line has been energized based on the compared temperature measurement signals further comprises determining which input power line has been energized based on at least one of a temperature change of one of the first and second heat generation devices and a temperature difference between the first and second heat generation devices.

19. A heating, ventilation, and air conditioning (HVAC) motor control system comprising:
an HVAC system controller configured to determine an operating mode of said HVAC motor control system;
an electric motor; and
an electric motor drive controller coupled to said electric motor, said motor drive controller comprising:
a plurality of power input lines, each power input line of said plurality of power input lines configured to receive an alternating current (AC) input voltage from an AC power source;
an energized line detection device configured to sense that a power input line of said plurality of power input lines has been energized by the AC power source, and configured to output an isolated signal, said energized line detection device comprising a current transformer having a primary winding and a secondary winding, said each input power line coupled to a respective turn of said primary winding; and
a computing device coupled downstream from said energized line detection device and configured to:

receive the isolated signal output by said current transformer, the isolated signal representing a conditioned voltage signal $V_c$;

receive a measured motor operation condition of said electric fan motor;

calculate an energized line value given by $$x = k \times Vc / \frac{P_{out}}{\eta + V_{DC}},$$

wherein k represents a predetermined scaling factor, $P_{out}$ represents an output power of the electric motor, $V_{DC}$ represents a measured DC link voltage, and $\eta$ represents motor efficiency; and determine which input power line of said plurality of input power lines has been energized based on the calculated energized line value and the measured motor operation condition.

20. A system in accordance with claim 19, wherein said computing device is configured to determine which input power line has been energized based on a lookup table that relates the isolated signal and the measured motor operation condition to an energized state of each of said plurality of input power lines.

21. An electric motor drive controller configured to be coupled to an electric motor, said electric motor drive controller comprising:

a plurality of power input lines, each power input line of said plurality of input power lines configured to receive an alternating current (AC) input voltage from an AC power source;

an energized line detection device configured to sense that a power input line of said plurality of power input lines has been energized by the AC power source, and configured to output an isolated signal, said energized line detection device comprising a current transformer having a primary winding and a secondary winding, said each input power line coupled to a respective turn of said primary winding; and a computing device coupled downstream from said energized line detection device and configured to:

receive the isolated signal output from said secondary winding of said current transformer;

calculate an energized line value given by $$x = k \times Vc / \frac{P_{out}}{\eta + V_{DC}},$$

wherein k represents a predetermined scaling factor, $V_c$ represents a conditioned voltage signal output by said current transformer, $P_{out}$ represents an output power of the electric motor, $V_{DC}$ represents a measured DC link voltage, and $\eta$ represents motor efficiency; and determine which input power line of said plurality of input power lines has been energized based on the calculated energized line value.

* * * * *